(12) United States Patent
Otose (10) Patent No.: US 7,355,323 B2
(45) Date of Patent: Apr. 8, 2008

(54) PIEZOELECTRIC DEVICE, DROPLET JETTING DEVICE USING THE SAME, AND IMAGE OUTPUT DEVICE

(75) Inventor: Tomohiko Otose, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/187,964

(22) Filed: Jul. 25, 2005

(65) Prior Publication Data

US 2006/0017351 A1 Jan. 26, 2006

(30) Foreign Application Priority Data

Jul. 23, 2004 (JP) ............................. 2004-216325

(51) Int. Cl.
*H01L 41/09* (2006.01)
(52) U.S. Cl. ..................................... 310/317
(58) Field of Classification Search ................ 310/317, 310/318
See application file for complete search history.

(56) References Cited

U.S. PATENT DOCUMENTS

| | | | | |
|---|---|---|---|---|
| 5,010,355 A | * | 4/1991 | Hawkins et al. .............. | 347/64 |
| 6,796,637 B2 | * | 9/2004 | Kitagawa et al. .............. | 347/68 |
| 2002/0008441 A1 | * | 1/2002 | Nariai .......................... | 310/317 |
| 2003/0136966 A1 | * | 7/2003 | Inoue et al. .................. | 257/79 |
| 2003/0206332 A1 | * | 11/2003 | Yamazaki et al. .......... | 359/312 |
| 2004/0202819 A1 | * | 10/2004 | Frost et al. ................. | 428/136 |
| 2005/0052492 A1 | * | 3/2005 | Ikeda et al. .................... | 347/40 |
| 2005/0062781 A1 | * | 3/2005 | Shinkawa ..................... | 347/19 |
| 2005/0190232 A1 | * | 9/2005 | Lee et al. ..................... | 347/45 |
| 2006/0113863 A1 | * | 6/2006 | Kawaguchi et al. ........ | 310/314 |

FOREIGN PATENT DOCUMENTS

| JP | 11-191645 | 7/1999 |
|---|---|---|
| JP | 2003-69103 | 7/2003 |

* cited by examiner

*Primary Examiner*—Darren Schuberg
*Assistant Examiner*—Derek Rosenau
(74) *Attorney, Agent, or Firm*—Young & Thompson

(57) ABSTRACT

A piezoelectric device includes a flexible substrate and a piezoelectric element including a pair of electrodes each positioned on the flexible substrate. A switching element is connected to one of the pair of electrodes, in the flexible substrate, and a common line is connected to the other of the pair of electrodes, on the flexible substrate.

14 Claims, 12 Drawing Sheets

PIEZOELECTRIC DEVICE, DROPLET JETTING DEVICE USING THE SAME, AND IMAGE OUTPUT DEVICE

BACKGROUND OF THE INVENTION

1. Field of the Invention

The present invention relates to a piezoelectric device, a droplet jetting device that uses the same, and an image output device.

2. Description of the Related Art

A piezoelectric element (electrostrictive element) is an element that vibrates according to an electric signal or that generates an electric signal according to its own vibration caused by an external force. JP 11-191645 (reference 1) and JP 2003-069103 (reference 2) disclose devices that include such a piezoelectric element respectively.

Figure 14A:
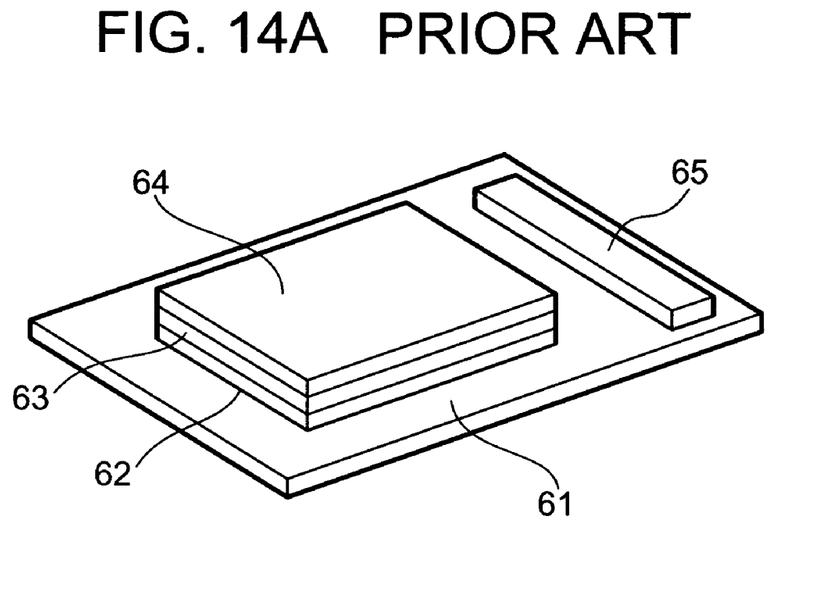
FIG. 14A is a perspective view of a configuration of a known piezoelectric element.

The device disclosed in the reference 1 is an example of a piezoelectric/electrostrictive actuator. FIG. 14A is a perspective view of a configuration of the actuator. The piezoelectric/electrostrictive actuator comprises a thin substrate 61, an intermediate layer 62, a piezoelectric/electrostrictive film 63, an electrode film 64, and an electrode 65. The piezoelectric/electrostrictive film 63 is provided between the electrode layer 64 and the intermediate layer 62 and the piezoelectric/electrostrictive film 63 is connected to an external device (not shown) through the electrode 64 with a lead wire and through the intermediate film 62, the thin substrate 61 and the electrode 65. And, according to an electric signal output from an external device and applied to the electrode film 64 and the intermediate layer 62 respectively, the piezoelectric/electrostrictive film 63 vibrates.

Figure 14B:
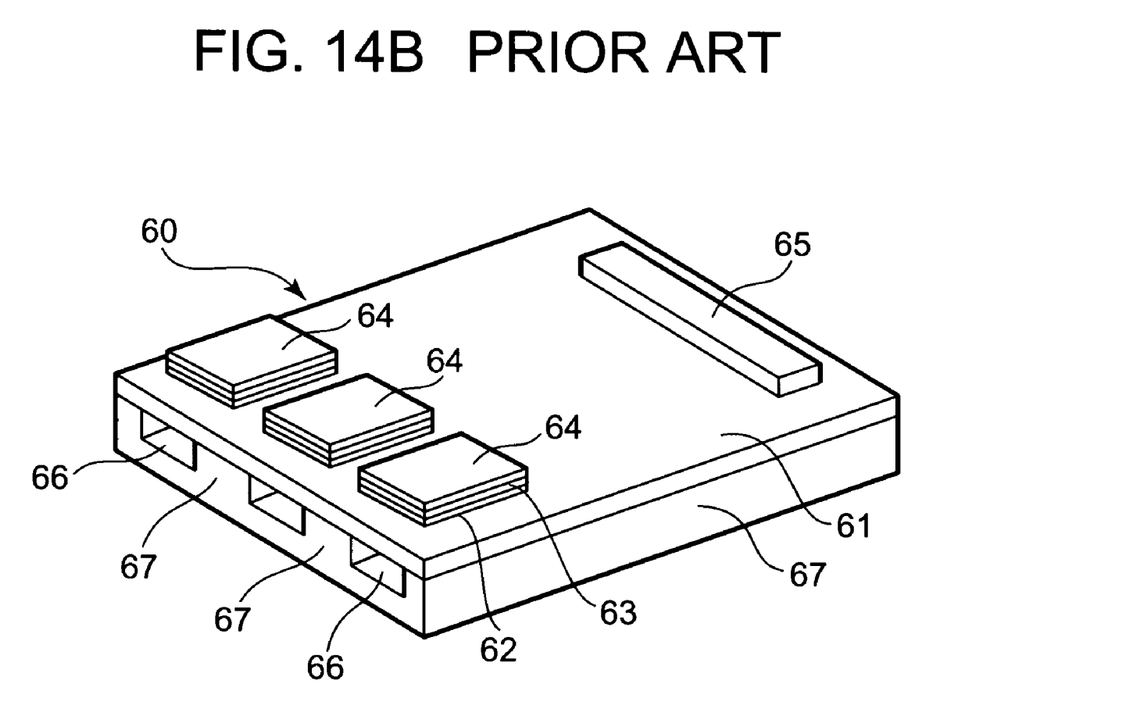
FIG. 14B is a perspective view of the configuration of the known piezoelectric element applied to an ink jet print head.

FIG. 14B is a perspective view of the piezoelectric/electrostrictive actuator disclosed in the same document, which is applied to an ink jet print head. The ink jet print head 60 comprises a thin substrate 61, an intermediate layer 62, a piezoelectric/electrostrictive film 63, an electrode film 64, and an electrode 65, a recess 66, and a partition wall 67. Portions above the thin substrate 61 are the same as those shown in FIG. 14A. The recess 66 and the partition wall 67 are provided under the thin substrate 61.

Figure 16:
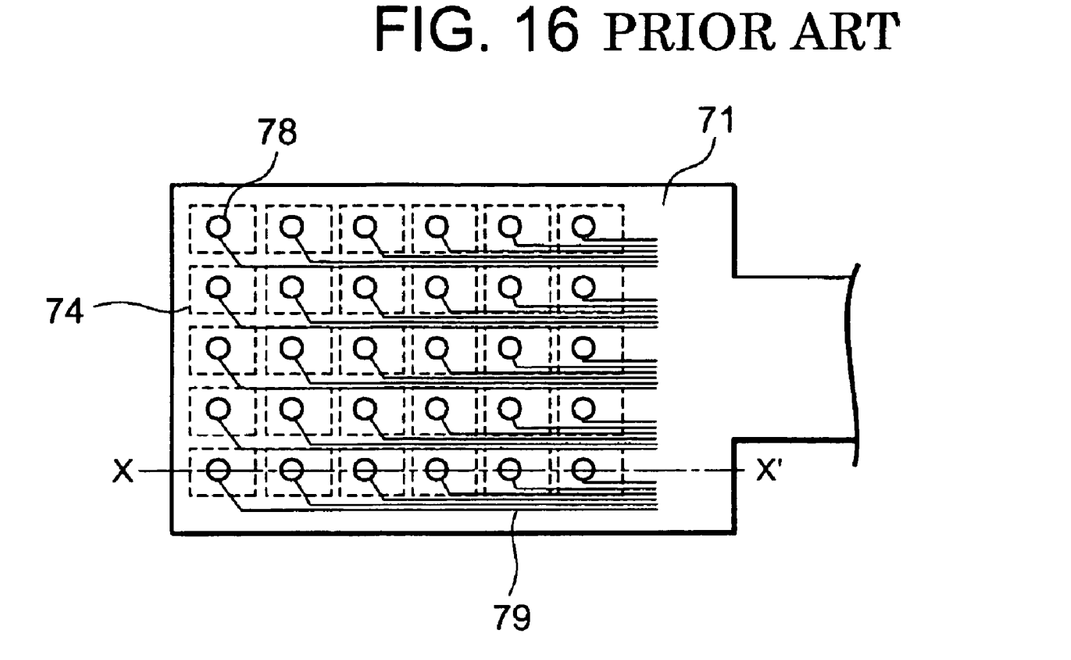
FIG. 16 is a top view of a configuration of a known piezoelectric/electrostrictive actuator.

The reference 2 discloses an example of a piezoelectric/electrostrictive actuator that includes a piezoelectric element. FIG. 16 is a top view of the configuration of the piezoelectric/electrostrictive actuator. The piezoelectric/electrostrictive actuator is configured by a flexible printed wiring board 71, a plurality of bumps 78, a plurality of electric wirings 79, and a plurality of actuator elements 74.

Figure 17:
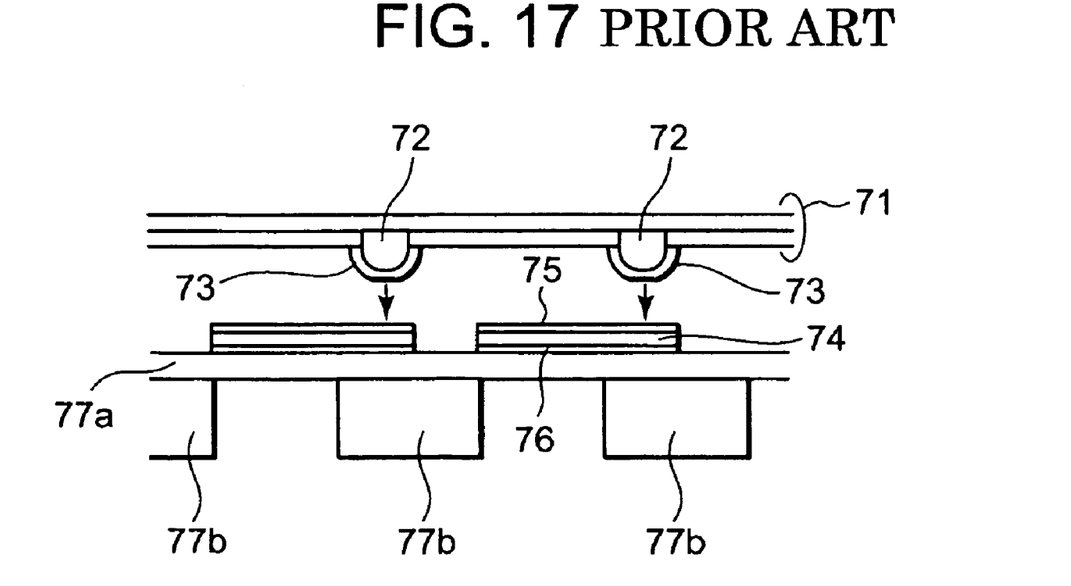
FIG. 17 is an expanded cross sectional view of a portion of the known piezoelectric/electrostrictive actuator.

FIG. 17 is a cross sectional view of the piezoelectric/electrostrictive actuator shown in FIG. 16 the X-X' line. The piezoelectric/electrostrictive actuator is configured by a plurality of core members 72, a plurality of junction materials 73, a plurality of actuator elements 74, a plurality of signal electrodes 75, a plurality of common electrodes 76, and a plurality of stainless thin plates 77a and 77b.

If a plurality of piezoelectric/electrostrictive actuators disclosed in the references 1 and 2 are used to control the operation of each of those actuators, each piezoelectric element requires a switching circuit that includes a transistor. The number of parts in the device thus increases unavoidably. This is why it has been difficult to reduce the device in size.

At the same time, JP 2000-289196 discloses an ink jet print head that includes a plurality of thin film transistor united with each corresponding piezoelectric actuator on an insulated substrate.

Figure 18A:
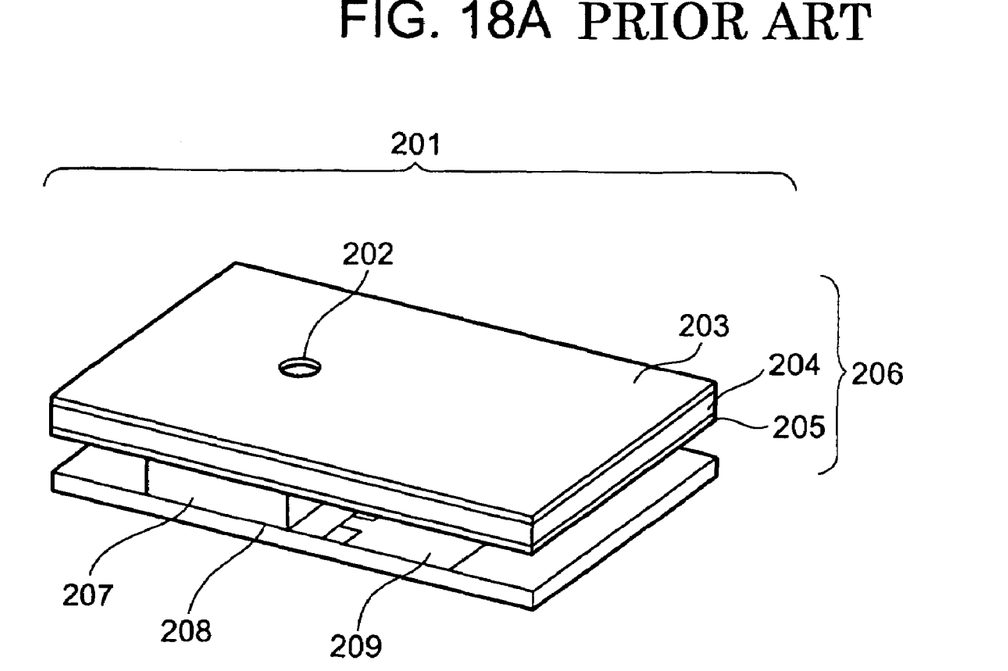
FIG. 18A is a perspective view of a configuration of a known piezoelectric/electrostrictive actuator element.
Figure 18B:
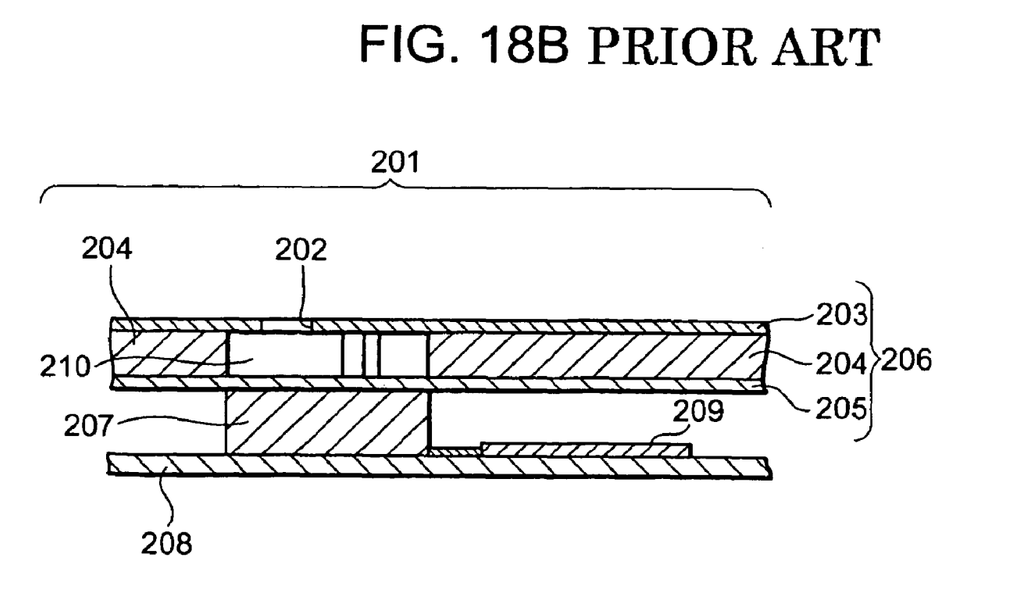
FIG. 18B is a cross sectional view of a configuration of a known piezoelectric/electrostrictive actuator element.

FIG. 18A is a perspective view of the ink jet print head 201 in the same document. FIG. 18B is a simplified across sectional view of the ink jet print head 201. The ink jet print head 201 comprises a body 206, a piezoelectric actuator 207 and an insulated substrate 208. The body 206 comprises a nozzle plate 203 including a small opening 202 as a nozzle, a pressure chamber material 204 configuring a pressure 210 chamber and a vibration plate 205. A thin film transistor circuit 209 transmitting an electric driving signal to the piezoelectric actuator 207, is configured on a surface of the insulated substrate 208 on which the piezoelectric actuator 207 vibrating the vibration plate 205 is mounted.

To make this ink jet print head, the thin film transistor 209 is formed on the insulated substrate in a conventional thin film transistor manufacturing process. The piezoelectric actuator 207 is formed next to the thin film transistor 209. After that, the body 206 including the vibrating plate 205, the pressure chamber material 204 and the nozzle plate 203 is formed. The vibrating plate 205 has a function as a common electrode of the piezoelectric actuator 207. The ink jet print head in the same reference can be reduced in size because the thin film transistor 209 is formed next to the piezoelectric actuator 209 on the insulated substrate, which is rigid.

SUMMARY OF THE INVENTION

The ink jet print head in the reference 3 could have a bad connection between the vibration plate 205 and the shorter piezoelectric actuator 207 because the height of the piezoelectric actuator varies widely by manufacturing errors and tolerances. The vibrating plate 205 serves as a common electrode so the ink jet print head doesn't work when it has a bad connection.

In the present invention, the thin film transistor can function as a switching element of the piezoelectric element to enable the piezoelectric element to operate when the thin film transistor is turned on. Consequently, if a plurality of piezoelectric elements are disposed such that each is positioned on the flexible substrate, the thin film transistor functions as a switching element for selecting a piezoelectric element that is ready to operate.

Furthermore, in the present invention, a piezoelectric element is provided on a flexible substrate as described above and it is preferred that the flexible substrate itself functions as a vibration plate. If the piezoelectric element is driven, the flexible substrate united with the piezoelectric element also comes to vibrate. In other words, the flexible substrate preferably functions as a vibration plate. This helps the piezoelectric device to be reduced in size.

Furthermore, in the present invention, a thin film transistor is provided on the flexible substrate and the transistor functions as a switching element of the piezoelectric element. Both of the electrodes of the piezoelectric element are connected on the flexible substrate so there is no bad connection even when a height of the piezoelectric element varies widely. Consequently, the yield rate is boosted.

Furthermore, according to the present invention, it is possible to provide a droplet jetting device that includes a liquid housing part for housing a liquid and a piezoelectric device configured so as to apply a pressure to the liquid housed in the liquid housing part.

Still further, according to the present invention, it is possible to provide an image output device for outputting an image by spraying droplets and the image output device includes a droplet jetting device as described above.

According to a preferred embodiment of the present invention, because a piezoelectric element and a thin film transistor are provided on a flexible substrate, a mounting defect is prevented.

The invention resides in the attainment of any one or more of the above-noted objectives, in whole or in part, and in any event is of a scope as set forth in the appended claims. Any inconsistency between the summary of the invention set forth above and the appended claims is to be resolved in favor of the claims.

DETAILED DESCRIPTION OF PREFERRED EMBODIMENTS

In the piezoelectric device of the present invention, a plurality of piezoelectric elements as described above may be disposed like a matrix on the flexible substrate. In that configuration, a switching element that is preferably a thin film transistor can be used to control each electric signal to be exchanged between each of the plurality of piezoelectric elements and an external circuit individually.

The piezoelectric device may be configured to include a supporting member for supporting the flexible substrate and provide the piezoelectric element in a region between portions of the flexible substrate, supported by the supporting member respectively. In that configuration, a movable region between the portions of the flexible substrate, supported by the supporting member respectively and the piezoelectric element can operate in conjunction with each other so that the movable region functions as a vibration plate. Consequently, while the flexible substrate is disposed stably by the supporting member, a region that functions as a vibration plate is secured between supporting members, thereby the piezoelectric device is realized effectively in a small space.

Furthermore, the thin film transistor may be provided at a portion of the flexible substrate, supported by the supporting member.

Because the flexible substrate functions as a vibration plate, much care should be paid not to lose the reliability of the thin film transistor in operation when the thin film transistor is to be provided on the flexible substrate. This is a very important technical subject. In the above configuration, because the thin film transistor is provided at a portion of the flexible substrate, supported by the supporting member and less used for operation, the thin film transistor is suppressed effectively from damages.

The flexible substrate may be a thinned one to improve the flexibility more. The flexible substrate thus comes to function as a vibration plate more effectively.

The thin film transistor may be provided in the flexible substrate. The total thickness of the flexible substrate can thus be reduced and the reliability of the thin film transistor in operation is improved more.

The piezoelectric device may also include a vibration plate disposed in contact with the piezoelectric element differently from the flexible substrate. The piezoelectric device may also further include a circuit for sending an electric signal to the piezoelectric element to control its operation. The thin film transistor functions as a switching element between the piezoelectric element and the circuit.

Furthermore, the piezoelectric device may also include a circuit for receiving an electric signal from the piezoelectric element to read its operation. The thin film transistor functions as a switching element between the piezoelectric element and the circuit. Consequently, the switching element corresponding to each subject piezoelectric element can be controlled to be turned ON/OFF according to a signal from the circuit to read each electric signal generated by the operation of each subject piezoelectric element. Electric signals generated from the piezoelectric element thus come to be read accurately.

Hereunder, embodiments of the present invention will be described with reference to the accompanying drawings. In all those drawings, the same reference numerals/symbols will be used for the same items to avoid redundant description.

First Embodiment

Figure 1:
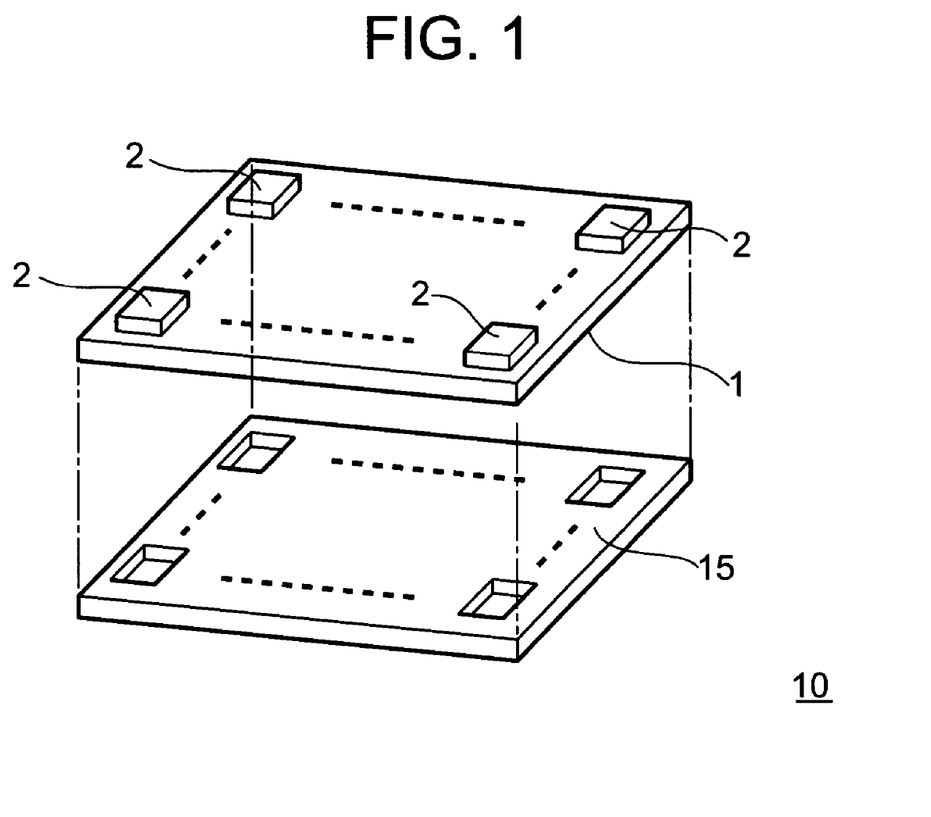
FIG. 1 is a perspective view of a configuration of a piezoelectric device in a first embodiment of the invention.

FIG. 1 shows a perspective view of a configuration of a piezoelectric device (flexible electronic device 10) in this first embodiment. A flexible electronic device 10 is configured by a flexible substrate 1, a piezoelectric element 2, and a supporting base 15. The piezoelectric element 2 is provided on the surface of the flexible substrate, surrounded by a region supported by the supporting base 15. In other words, a region of the flexible substrate 1, located just under the piezoelectric element 2, is not supported by the supporting base 15. In this way a region under the piezoelectric element 2 is hollowed out, so the piezoelectric element 2 is movable above and below. The supporting base 15 is rigid, so a region of the flexible substrate except for vibrating part is strengthened. A plurality of the piezoelectric elements 2 are disposed like a matrix on the surface of the flexible substrate 1 and their operations are controlled with an active matrix method. The piezoelectric element 2 is premised to include an electrostrictive element.

Although not shown here, a circuit that includes a thin film transistor to be described later is formed in the flexible substrate 1. The thin film transistor is provided at a portion of the flexible substrate 1, supported by the supporting base 15.

Figure 2:
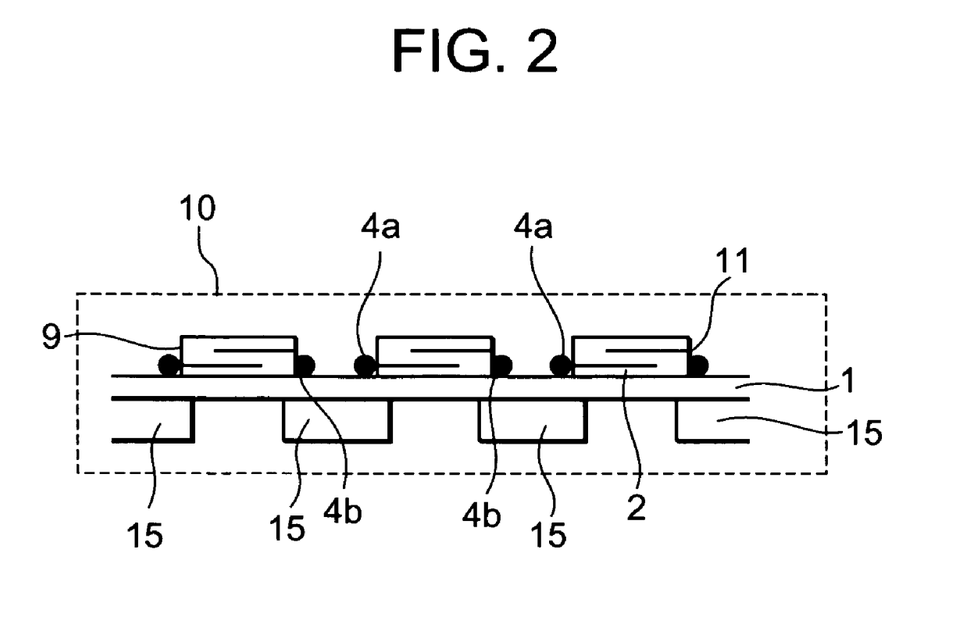
FIG. 2 is a cross sectional view of a perspective view of a configuration of a piezoelectric device in the first embodiment.

FIG. 2 is an expanded cross sectional view of a portion of the flexible electronic device 10 shown in FIG. 1. The flexible substrate 1 is provided on the supporting base 15 and a plurality of piezoelectric elements 2 are provided on the top surface of the flexible substrate 1. A signal electrode 9 and a common electrode 11 are connected to both end faces of the piezoelectric element 2 electrically through electric junctions 4*a* and 4*b*.

Figure 3:
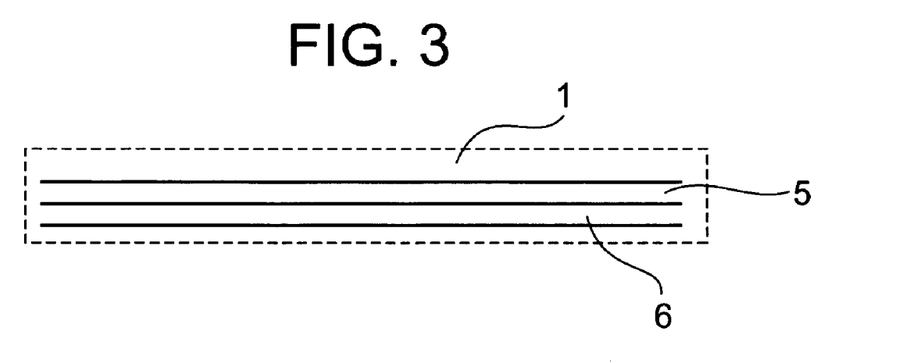
FIG. 3 is a cross sectional view of a configuration of a flexible substrate in the first embodiment.

FIG. 3 is an expanded cross sectional view of a multilayered structure of the flexible substrate 1 shown in FIG. 1. The flexible substrate 1 is configured by an insulated substrate 6 and a thin film transistor circuit layer 5 formed on the insulated substrate 6.

Figure 4:
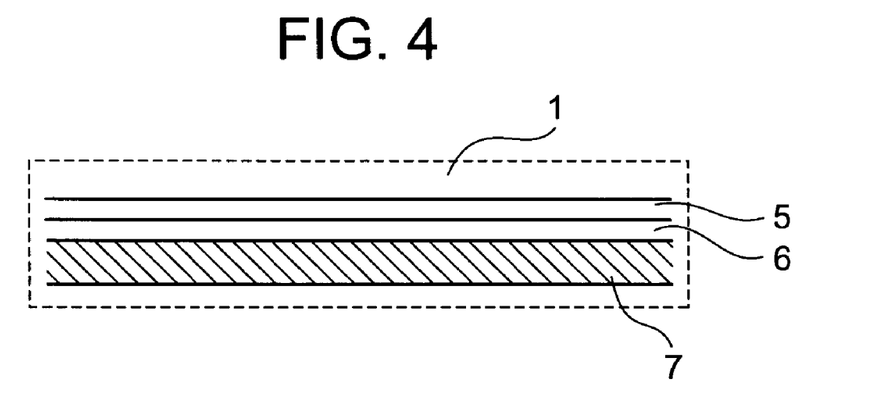
FIG. 4 is a cross sectional view of a variation of the flexible substrate in the first embodiment.

The flexible substrate 1 may further include a flexible film 7 formed on a surface of the insulated substrate 6 oppositely to a surface on which the thin film transistor circuit layer 5 is formed as shown in FIG. 4. In this way the flexible substrate is flexible and high-strength.

Figure 5:
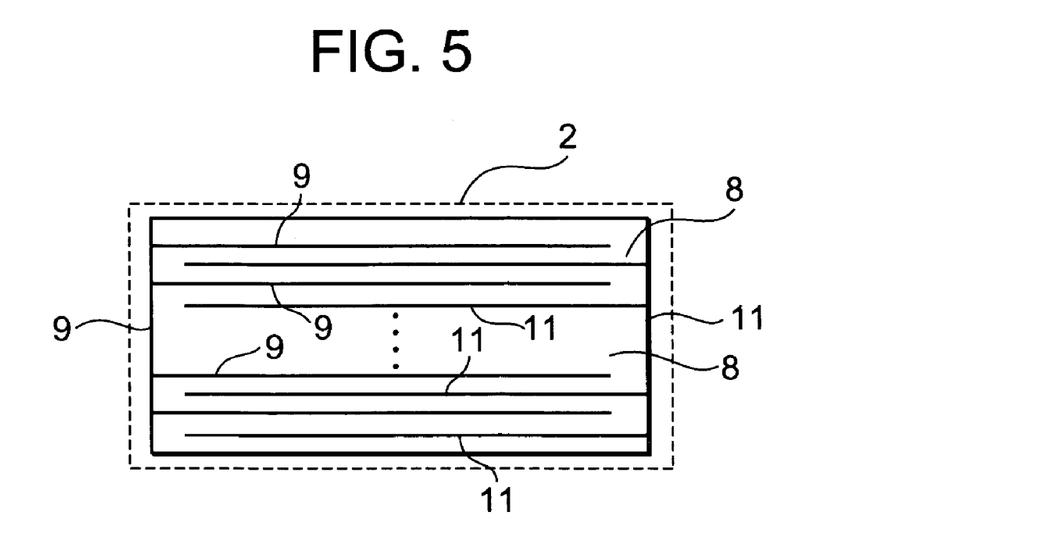
FIG. 5 is a cross sectional view of the configuration of the piezoelectric element in the first embodiment.

FIG. 5 is a cross sectional view of the configuration of the piezoelectric element 2 shown in FIG. 1. The piezoelectric element 2 is structured as a multilayer comprising a piezoelectric element/electrostrictive material 8, a signal electrode 9, and a common electrode 11. In other words, the piezoelectric element 2 has a zigzag multilayer disposed between the signal electrode 9 and the common electrode 11.

The piezoelectric element/electrostrictive material 8 is transformed with an electric field generated between the signal electrode 9 and the common electrode 11. The material should preferably be, for example, lead zirconate titanate ceramic (hereunder, to be described as PZT as needed), but may also be another material if it is transformed as desired.

Figure 6:
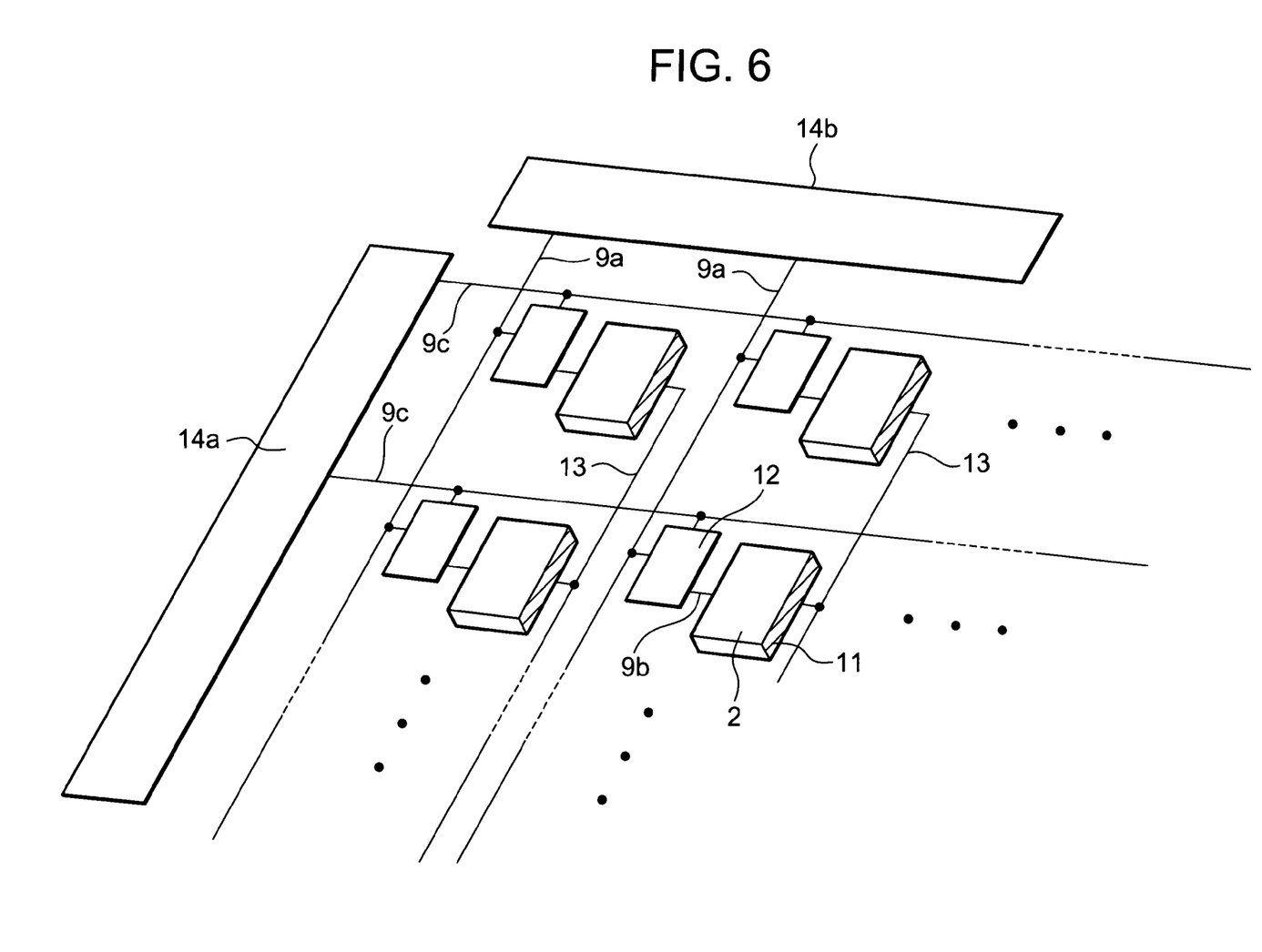
FIG. 6 is an expanded perspective view of a portion of a thin film transistor circuit in the first embodiment.

FIG. 6 is an expanded perspective view of a portion of the thin film transistor circuit layer 5 shown in FIG. 3. The transistor circuit layer 5 is configured by a control signal line 9*c*, data signal lines 9*a* and 9*b*, a switch circuit 12, a common line 13, and a control circuit 14*a*, 14*b*. In the thin film transistor circuit layer 5, the signal electrode 9 of the piezoelectric element 2 provided on the flexible substrate 1 is connected to the data signal line 9*b* through an electric junction 4*a*. The common electrode 11 is connected to the common line 13 through an electric junction 4*b*. The control signal line 9*c*, the data signal line 9*a*, and the common line 13 are connected to the control circuit 14*a*, 14*b* respectively.

The control circuit 14*a* includes a driver circuit (not shown) for receiving a control signal from an external device, then sending the control signal or another newly generated control signal to the control signal line 9*c*. The control circuit 14*b* includes a driver circuit (not shown) for receiving a data signal from an external device, then sending the data signal or another newly generated data signal to the data signal line 9*a*. The control circuit 14*a*, 14*b* includes a power supply circuit (not shown) for sending a given voltage to the common line stably.

Figure 7A:
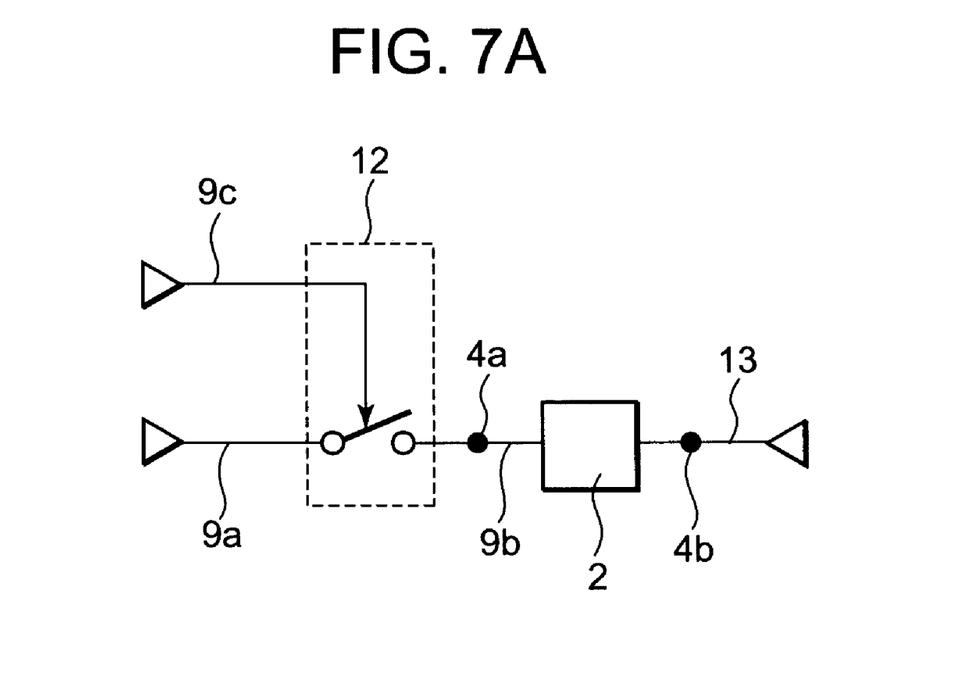
FIGS. 7A and 7B are a circuit diagram of a portion of the thin film transistor circuit in the first embodiment.

FIG. 7A is a circuit diagram for showing part of the thin film transistor circuit layer 5 shown in FIG. 3. The switch circuit 12 in the circuit diagram is connected to the control signal line 9*c*, the data signal line 9*a*, and the data signal line 9*b* respectively. The switch circuit 12 has functions to control the continuity/non-continuity of each of the data signal lines 9*a* and 9*b* according to a control signal transferred thereto through the control signal line 9*c*.

Figure 8:
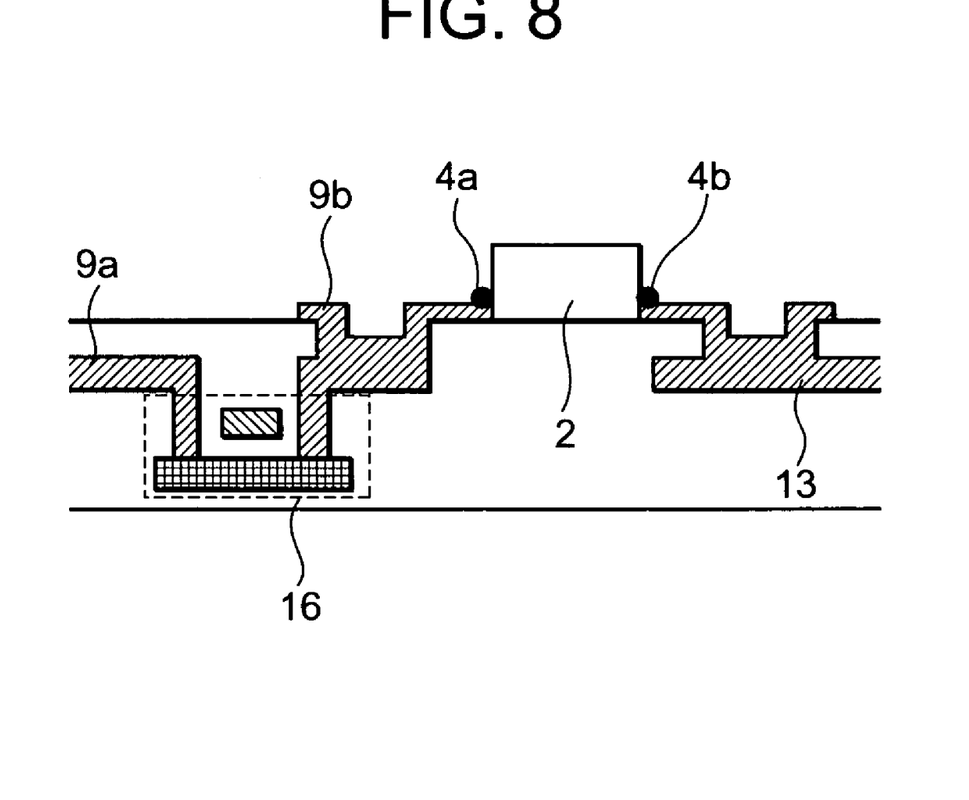
FIG. 8 is a cross sectional view of the portion of the thin film transistor circuit in the first embodiment.

FIG. 8 is a cross sectional view of apportion of the thin film transistor circuit layer 5 shown in FIG. 3. The switch circuit 12 includes a thin film transistor 16. The data signal line 9*b* is connected to the electric junction 4*a* of the piezoelectric element 2. The common line 13 is connected to the electric junction 4*b* of the piezoelectric element 2.

The electric junctions 4*a* and 4*b* are made of ball solder and are used to connect the data signal line 9*b* and the common line 13 included in the thin film transistor circuit layer 5 to the signal electrode 9 and the common electrode 11 of the piezoelectric element 2 electrically. This is why data signals are transferred to the piezoelectric element 2 surely to make desired operations and the electric connection to many piezoelectric elements are enabled surely.

Figure 7B:
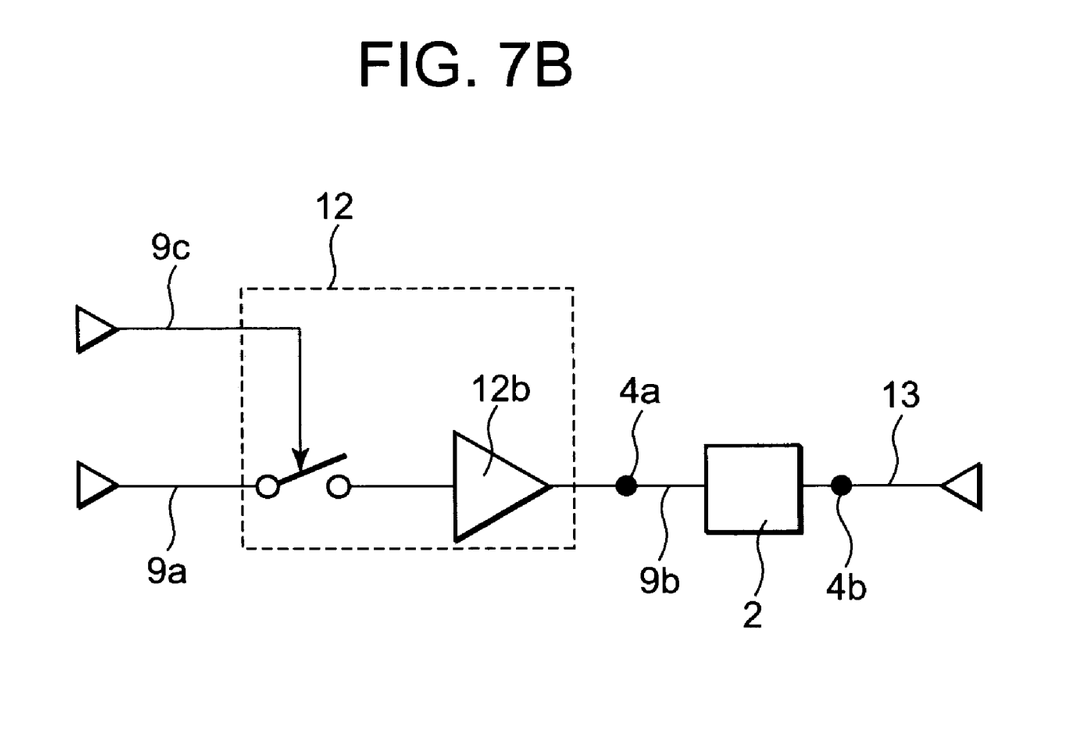

The switch circuit 12 may also be configured differently to have an amplification circuit 12*b* for amplifying inputted data signals shown in FIG. 7B other than the configuration shown in FIG. 7A. In that connection, a data signal inputted from an external device to the flexible electronic device 10 may be a signal having a small amplitude. In that configuration, the external device is not required to have a large output amplification circuit, thereby the device cost is suppressed. And, the amplitude of each data signal when passing a line on the flexible substrate 1 is lowered, thereby the power consumption is lowered. The switch circuit 12 can thus be applied effectively for portable battery-driven devices.

The above data signal is used to specify displacement of the piezoelectric element 2, but an input data signal may just be required to be a binary digital signal if there are only two states of the piezoelectric element 2, that is, driving state and not-driving state. If the displacement of the piezoelectric element must be changed with time, analog signals may be supplied to the piezoelectric element 2.

The operation of the flexible electronic device 10 in this first embodiment will now be described.

If a data signal from an external device is transferred to the control circuit 14*a*, 14*b* shown in FIG. 6, the control signal is supplied to the control signal line 9*c* provided in the control circuit 14 and a data signal is supplied to the data signal line 9*a*. If the control signal is transferred to the connected switch circuit 12 through the control signal line 9*c*, the switch circuit 12 is turned on, thereby the data signal line 9*a* is connected to the data signal line 9*b*. Consequently, the data signal is supplied to the signal electrode 9 provided in the piezoelectric element.

Figure 9:
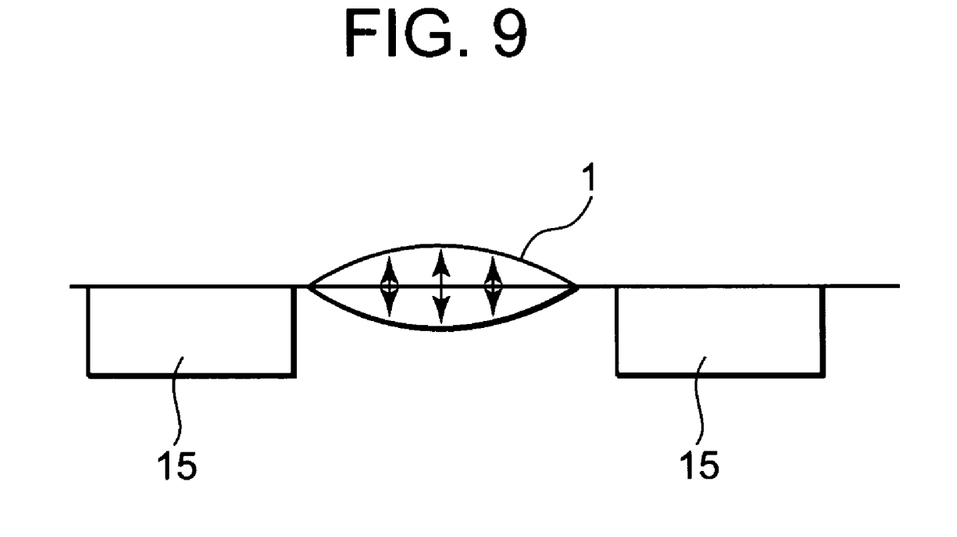
FIG. 9 is a cross sectional view for describing the operation of the piezoelectric device in the first embodiment.

FIG. 9 is a cross sectional view of the flexible electronic device 10 for describing the operation. If a data signal is supplied to the piezoelectric element 2, the piezoelectric element/electrostrictive material included in the piezoelectric element 2 is transformed by an electric field generated in the piezoelectric element 2. As a result, the entire piezoelectric element 2 is also transformed, so that the flexible substrate 1 begins vibrating in the vertical direction at a fulcrum (supporting base 15) in connection with the transformation of the piezoelectric element 2.

At that time, the piezoelectric element 2 is provided in a region between portions of the flexible substrate 1, supported by the supporting base respectively, so that the operation of the piezoelectric element 2 is transmitted directly to the flexible substrate 1, thereby the movable region of the flexible substrate 1 begins vibrating. The thin film transistor is provided in a portion of the flexible substrate 1, supported by the supporting base 15, so that the flexible substrate 1 is suppressed from damages to be caused by the vertical vibration.

Next, an example of how to manufacture the flexible substrate in this mode will be described.

FIGS. 10A~10I are cross sectional views of the flexible substrate 1 shown in FIG. 3 for describing a process of how to manufacture. The cross sectional views shown in FIGS. 10A~10I are for manufacturing the thin film transistor circuit layer 5 on a glass substrate using polysilicon.

Figure 10A:
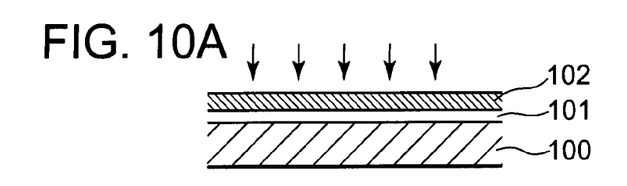
FIGS. 10A~10I are a cross sectional view of the flexible substrate in the first embodiment for describing a manufacturing process.

At first, a silicon oxide film 101 is formed on a glass substrate 100, then an amorphous silicon film 102 is deposited thereon. The silicon oxide film 101, which is formed between the glass substrate 100 and the amorphous silicon film 102, can suppress to diffuse impurities in the glass substrate 100 into be exerted on the amorphous silicon film 102. After that, the surface is annealed with an excimer layer beam to poly-siliconize the amorphous silicon (FIG. 10A).

Figure 10B:
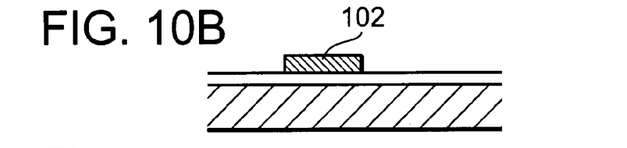

After that, a photoresist film is formed on the surface, then subjected to exposure and development processes to form a resist pattern. Then, the resist pattern is used as a mask to pattern the polysilicon film 102 in an etching process (FIG. 10B)

Figure 10C:
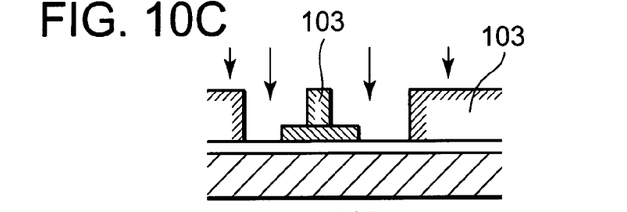

A photoresist film 103 is then coated on the surface, then the photoresist 103 is exposed and developed for patterning the photoresist 103, which is then doped to form both n-channel source and drain regions (not shown) (FIG. 10C).

Figure 10D:
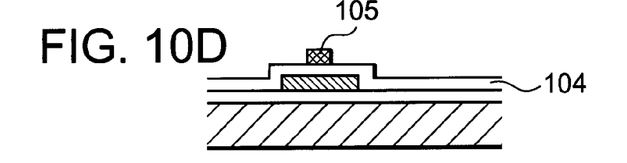

After that, silicon oxide film 104 having, for example, a thickness of 90 nm is formed, then a layer comprising microcrystal silicon ($\mu$-c-Si) and tungsten silicide (WSi) is deposited thereon. The layer is then patterned to form the gate electrode 105 (FIG. 10D).

Figure 10E:
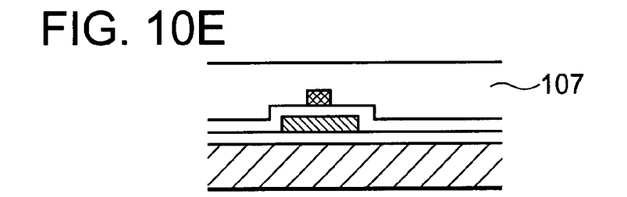
Figure 10F:
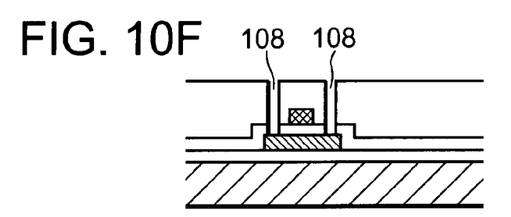

After that, an interlayer film 107 consisting of a silicon oxide film or silicon nitride film is laminated on the surface (FIG. 10E). After that, a contact hole 108 is formed in the above interlayer film 107 so as to reach the polysilicon film 102 or gate electrode 105 (FIG. 10F).

Figure 10G:
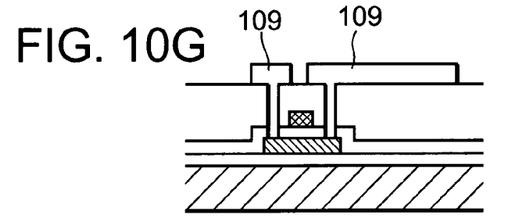
Figure 10H:
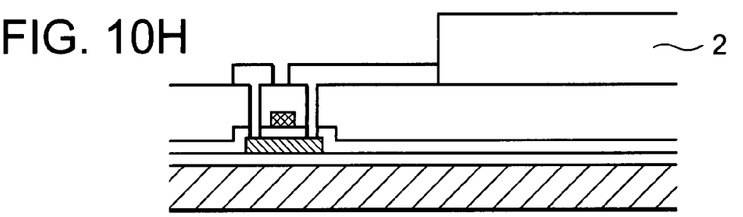
Figure 10I:
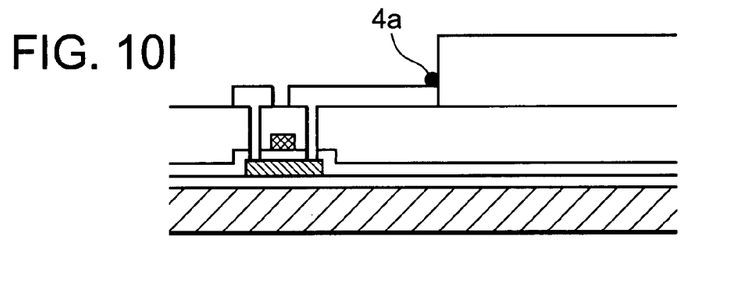

After that, an electrode layer 109 is made of aluminum or chrome with a sputtering method, then patterned into a predetermined shape (FIG. 10G).

The flexible substrate 1 having an n-channel TFT is thus manufactured. In this first embodiment, excimer laser is used to form the polysilicon film, but another laser, for example, a CW layer that oscillates continuously or the like may be used or solid layer deposition with thermal treatment may be employed.

In this way, the thin film transistor circuit 5 is formed of polysilicon on the glass substrate 100 (insulation film 6) in the process shown in FIGS. 10A~10I.

As described above, the insulated substrate 6 (glass substrate 100) on which the thin film transistor circuit 5 is formed is then dipped in a mixed solution of hydrofluoric acid and hydrochloric acid. At that time, if the thin film transistor circuit 5 is formed on the front side, the insulated substrate 6 is dipped into the mixed solution from the backside to etch the substrate 6 (glass substrate 100). The etching process condition to be assumed at that time should be selected by taking consideration to both economical efficiency and productivity. When the insulated substrate 6 (glass substrate 100) is thinned by etching in this way, the total thickness of the flexible substrate 1 is reduced, thereby the flexibility of the substrate 1 is improved. And, the flexible substrate 1 comes to function favorably as a vibration plate.

While the flexible substrate 1 shown in FIG. 3 is manufactured in the above process, if a film 7 is stuck on a surface on which the thin film transistor circuit layer 5 of the insulated substrate 6 is not formed after the process is ended, the flexible substrate 1 shown in FIG. 4 is manufactured.

After that, a plurality of piezoelectric elements 2 are disposed on/fastened to the thin film transistor circuit layer 5 provided on the flexible substrate 1 in a pressing/vibrating process or the like. After that, both of the signal electrode 9 and the data signal line 9b of each piezoelectric element 2 are connected with each other with ball solder, then the common electrode 11 and the common line 13 are connected to each other with ball solder to obtain the flexible electronic device 10 (piezoelectric device).

Hereunder, the function/effect of the flexible electronic device 10 in this first embodiment will be described.

Firstly, the flexible electronic device 10 can boost mounting yield. In other words, the flexible electronic device 10 has a thin film transistor circuit that includes a thin film transistor 16 in the flexible substrate 1 and a piezoelectric element 2 on the surface of the flexible substrate 1. Both the signal electrode 9 and the common electrode 11 of the piezoelectric element 2 are connected to the data signal line 9b and the common line 13 on the flexible substrate 1 respectively. So if the height of each of the piezoelectric elements is different, there is no bad connection. Consequently, the flexible electronic device 10 can boost mounting yield.

In addition, because the flexible substrate 1 that is thinned is excellent in flexibility, the substrate 1 functions favorably as a means for transmitting the vibration of the piezoelectric element 2 to the object. The device 10 does not require a means for transmitting the vibration of the piezoelectric element 2. This is why the device is reduced in size.

The flexible electronic device 10 in this first embodiment can also be manufactured with a method that employs a silicon treatment process and this makes it possible to reduce the device in size. In addition, the thin film transistor circuit layer 5 can be formed so as to be buried in the flexible substrate 1, thereby the device is reduced in height. The common electrode 11 in this first embodiment doesn't need to be a common electrode of all elements. For example, the common electrode 11 is divided into two or more parts and may be driven by time-sharing.

Second Embodiment

Figure 11:
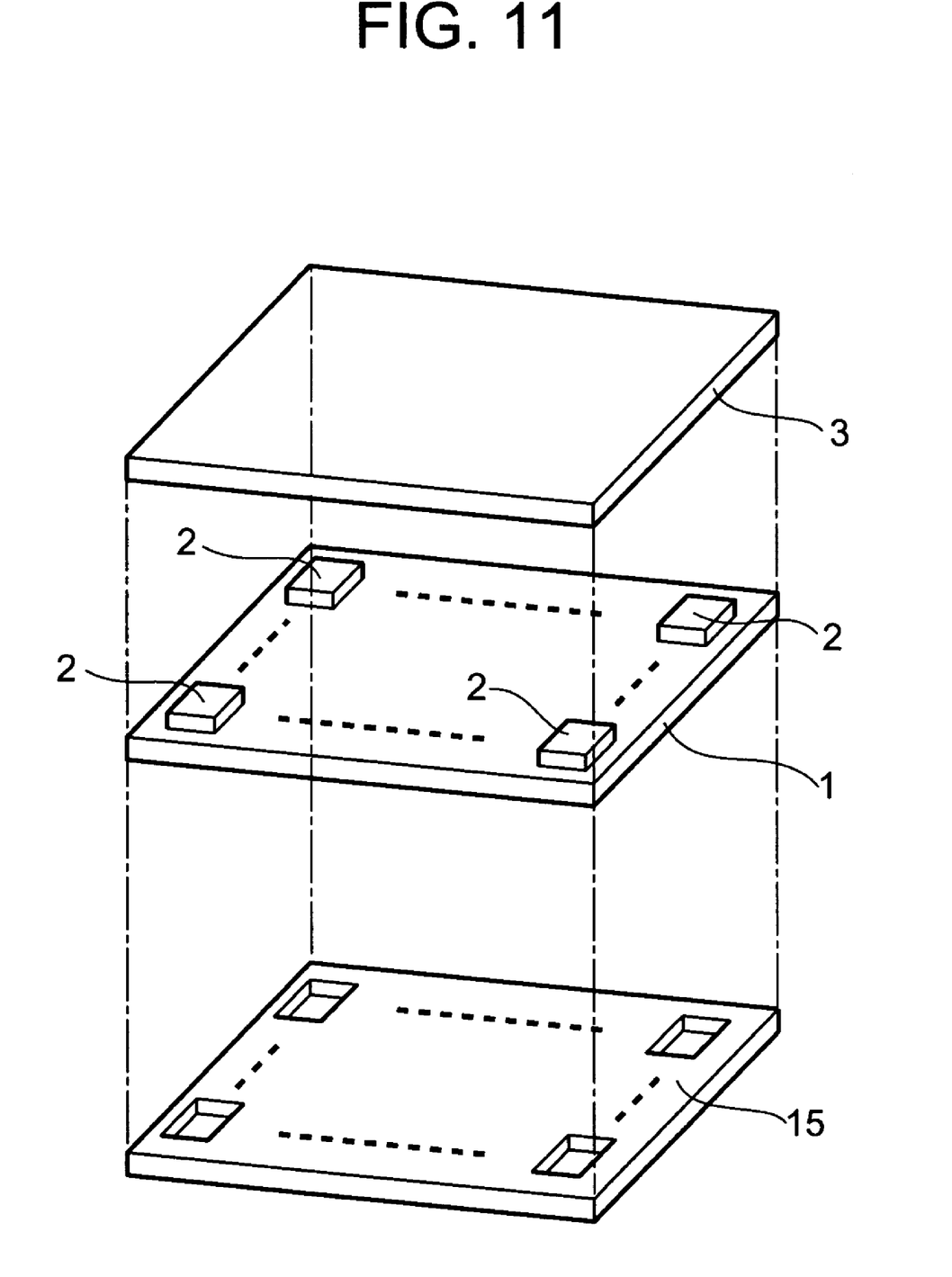
FIG. 11 is a perspective view of a configuration of a piezoelectric device in a second embodiment of the invention.

FIG. 11 is a perspective view of a configuration of a piezoelectric device in this second embodiment. A flexible electric device 10, which is a piezoelectric device in this second embodiment, is configured by a supporting base 15, a flexible substrate 1, a piezoelectric element 2, and a vibration plate 3. The flexible electric device 10 in this second embodiment includes a vibration plate 3. This is only a difference from that in the first embodiment.

The piezoelectric element 2 is provided on the surface of a region enclosed by a portion supported by the supporting base 15 on the flexible substrate 1. In other words, a region of the flexible substrate 1, located just under the piezoelectric element 2, is not supported by the supporting base 15. In this way a region under the piezoelectric element 2 is hollowed out, so the piezoelectric element 2 is movable above and below. The supporting base 15 is rigid, so a region of the flexible substrate except for vibrating part is strengthened. And, a plurality of the piezoelectric elements 2 are disposed like a matrix on the surface of the flexible substrate 1 so that the operations of those piezoelectric elements are controlled with an active matrix method.

Although not shown here, a circuit that includes a thin film transistor is formed in the flexible substrate 1 as to be described later. The thin film transistor is provided at a portion of the flexible substrate 1, supported by the supporting base 15.

Figure 12:
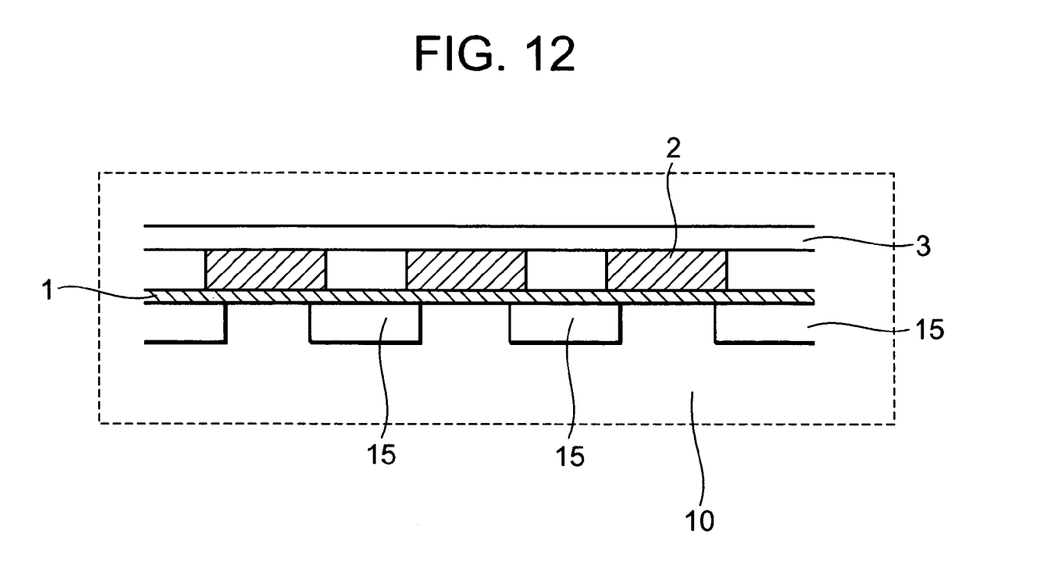
FIG. 12 is a cross sectional view of the configuration of the piezoelectric device in the second embodiment.

FIG. 12 is a cross sectional view of the configuration of the flexible electronic device 10 shown in FIG. 11. The flexible electronic device 10 includes a supporting base 15, a flexible substrate 1, a plurality of piezoelectric elements 2, and a vibration plate 3. The vibration plate 3 is vibrated by the piezoelectric element 2. The flexible substrate 1 may have a thin film transistor circuit layer 5 on the insulated substrate 6 as shown in FIG. 3 or have a film 7 laminated on a surface of the insulated substrate 6 on which the thin film transistor circuit layer 5 is formed, which is opposite to the thin film transistor circuit layer 5 as shown in FIG. 4.

The operation of the piezoelectric element is the same in both this second and first embodiments. In other words, just like in the first embodiment, the flexible substrate 1 transforms/vibrates in conjunction with the operation (transformation/vibration) of the piezoelectric element 2. And, according to the operation (transformation/vibration) of the piezoelectric element 2, the vibration plate 3 provided separately from the flexible substrate 1 also transforms/vibrates similarly.

In the manufacturing method of the flexible substrate 1 in this second embodiment, the piezoelectric element 2 and the thin film transistor circuit layer 5 are manufactured in the same way as in the first embodiment.

Third Embodiment

This third embodiment describes an example of a piezoelectric element used as a passive device. Just like in the first embodiment, the flexible electronic device 10 in this third embodiment employs the configuration of the electronic device 10 shown in FIG. 1. The flexible electronic device 10 also employs the cross sectional structure of the flexible electronic device 10 shown in FIG. 2.

As to be described later, the operation of the flexible electronic device 10 in this third embodiment differs from that in the first embodiment.

In the first embodiment, the piezoelectric element 2 transforms/vibrates according to an electric signal received from external. In this third embodiment, however, the piezoelectric element 2 itself transforms due to an external physical action, thereby outputting an electric signal. The piezoelectric element 2 makes good use of such a function. In other words, the flexible electronic device 10 in this third embodiment converts an external force to an electric signal with use of the above function.

In other words, the flexible electronic device 10 in this third embodiment is a passive device that uses the piezoelectric element 2 and differs from the active device in the first or second embodiment in that the electric signal generated when the transformation/vibration of the piezoelectric element 2, caused by an external physical action, is transferred to an external device (not shown).

Next, the operation of this third embodiment will be described with reference to FIG. 2. If an external force is applied to the piezoelectric element 2. It transforms at the displacement corresponding to the external force at that time, an electric signal is output from the piezoelectric element 2 to the thin film transistor circuit layer 5 on the flexible substrate 1 through the electric connection points 4a and 4b. How to manufacture the flexible electronic device 10 in this third embodiment is the same as that in the first embodiment.

The function and effect of the flexible electronic device 10 in this third embodiment are basically the same as those in the first embodiment. Even when the device 10 is used as an active device in the first embodiment while it is used as a passive device in the third embodiment, the device configuration is the same between those embodiments.

Fourth Embodiment

Just like in the second embodiment, the flexible electronic device 10 in this fourth embodiment employs the configuration of the electronic device 10 shown in FIG. 11. The flexible electronic device 10 also employs the cross sectional structure of the flexible electronic device 10 shown in FIG. 12.

As described below, the operation of the flexible electronic device 10 in this fourth embodiment differs from that in the second embodiment.

The operation of the flexible electronic device 10 in the second embodiment makes good use of a function of the piezoelectric element 2 that transforms/vibrates according to an electric signal received from external. On the other hand, the piezoelectric element 2 in this fourth embodiment makes good use of a function with which the piezoelectric element 2 itself transforms due to an external physical action to output an electric signal. In other words, the flexible electronic device 10 in this fourth embodiment converts an external force to an electric signal with use of the above function.

Next, the operation of the flexible electronic device 10 in this fourth embodiment will be described with reference to FIG. 11. If an external force is applied to the vibration plate 3, the piezoelectric element 2 that faces the vibration plate 3 transforms at the displacement corresponding to the external force output from the vibration plate 3. At that time, the piezoelectric element 2 outputs an electric signal to the thin film transistor circuit layer 5 provided on the flexible substrate 1 through an electric junction.

How to manufacture the flexible electronic device 10 in this fourth embodiment is the same as that in the second embodiment.

The function and effect of the flexible electronic device 10 in this fourth embodiment are basically the same as those in the second embodiment. Although the device 10 is an active device in the second embodiment and it is a passive device in this fourth embodiment, the device configuration is the same between those embodiments.

Fifth Embodiment

This fifth embodiment describes a case in which the flexible electronic device 10 that operates as described above is applied to an ink jet print head.

Figure 13:
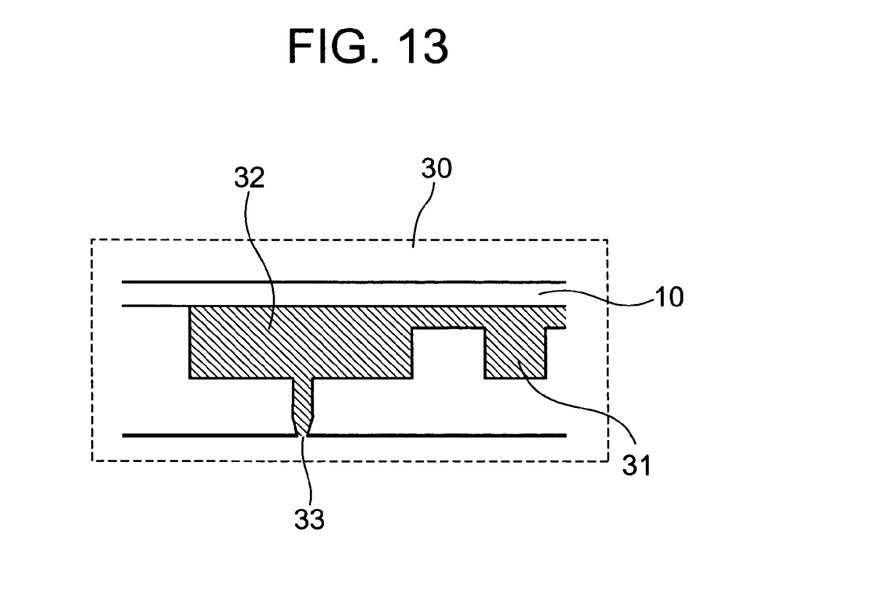
FIG. 13 is a cross sectional view of a configuration of an ink jet print head in a fifth embodiment.

FIG. 13 is a cross sectional view of a configuration of an ink jet print head in this fifth embodiment. The ink jet print head 30 in this fifth embodiment is configured by a flexible electronic device 10, an input chamber/flow path 31, a pressure chamber 32, and a nozzle 33.

In the first embodiment, the flexible-electronic device 10 is designed so that the flexible substrate 1 side shown in FIG. 2 is in contact with the pressure chamber 32. In the second embodiment, the vibration plate 3 side shown in FIG. 12 is in contact with the pressure chamber 32. Although the flexible substrate 1 in the first embodiment or the vibration plate 3 in the second embodiment transforms/vibrates due to the operation of the piezoelectric element 2 respectively, the substrate 1/vibration plate 3 is suitable for transmitting the movement to the pressure chamber 32.

The ink chamber/flow path 31 is configured to supply ink stably to the pressure chamber 32. The pressure chamber 32 transmits the transformation/vibration caused by the piezoelectric element 2 provided in the flexible electronic device 10 to the ink to be flown into the nozzle 33. The inner wall of the pressure chamber 32 is made of a material having high rigidity to transmit the pressure to the ink efficiently.

The nozzle 33 is configured to jet the ink flown from the pressure chamber 32 to an object to be printed from the ink jet print head 30. The nozzle 33 is provided corresponding to the piezoelectric element 2 provided in the flexible electronic device 10. The shape of each nozzle 33 is fit in a predetermined range, since the shape causes the variation of the jetting performance.

The manufacturing method of the flexible electronic device 10 in this fifth embodiment is the same as that in the first embodiment.

The operation of the ink jet print head in this fifth embodiment will be described. The operation of the flexible electronic device 10 in this fifth embodiment is the same as that in the first or second embodiment. In other words, the piezoelectric element provided in the flexible electronic device 10 receives an electric signal from an external circuit and transforms/vibrates according to the received signal, thereby transforming/vibrating the entire flexible electronic device 10.

According to the transformation/vibration of the piezoelectric element 2, the pressure of the ink in the pressure chamber 32 rises. And, according to the pressure rising, the ink is jetted from the nozzles 33. After that, when the pressure of the ink in the pressure chamber 32 falls, the ink jetting ends. Consequently, because the ink flow-out stops, the ink sprays as droplets. The ink droplets impact the print object to enable the desired printing.

Figure 15A:
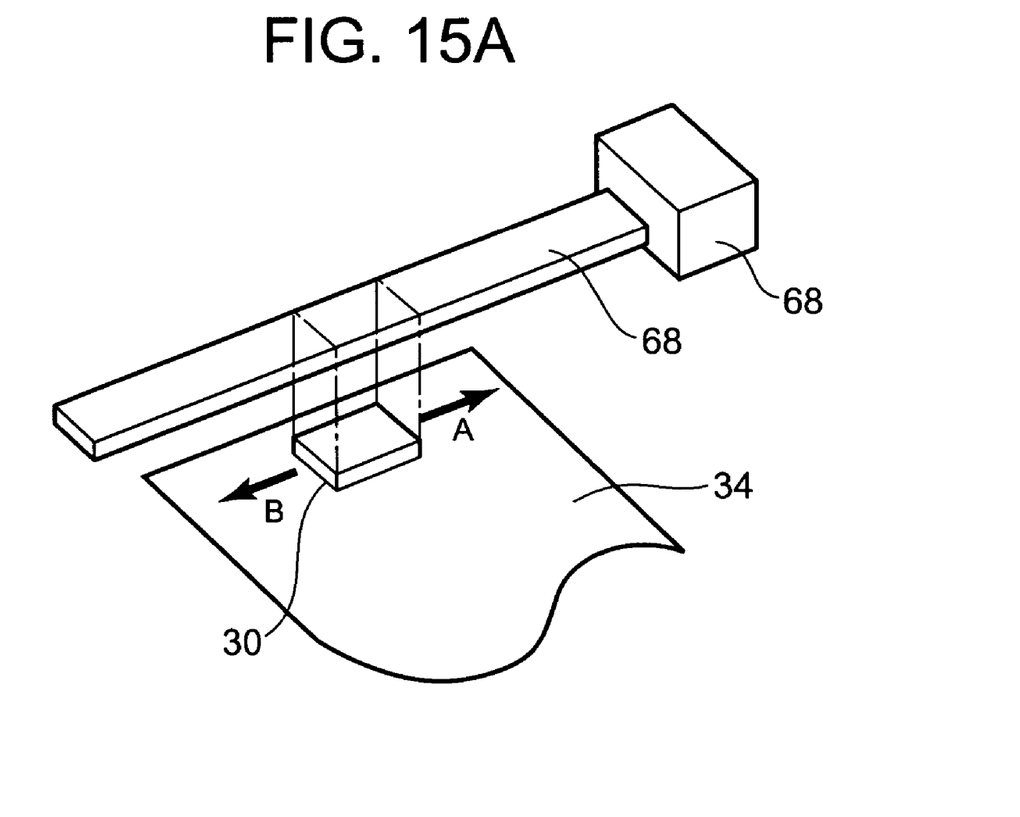
FIG. 15A is a perspective view of the configuration of the ink jet print head in a fifth embodiment.

The ink jet print head 30, as shown in FIG. 15A, is provided to face the print object 34 in the ink jetting direction. A driving system 68 in FIG. 15A moves the ink jet print head 30 in the direction A or B in FIG. 15A and configured mainly by a motor, a guide rail, etc.

FIG. 15A is a perspective view of a configuration of an ink jet print head in this fifth embodiment. Because the size of the ink jet print head 30 is generally smaller than the print object 34, the ink jet print head is scanned in the A-B direction to impact ink droplets onto the entire surface of the print object 34 to be printed out. Each ink droplets jetted from the ink jet print head 30 is thus impacted on facing print object 34.

The printing result becomes as follows; the larger the number of impacted ink droplets per unit area is, that is, the higher the density is, the more the printing result becomes fine. And, because the number of ink-droplets to impact per unit area can be changed for printing in gradation, the printing density becomes higher to enable multi-gradation printing. Consequently, high-defining/multi-gradation printing is enabled due to the piezoelectric elements 2 provided in high density on the ink jet print head 30.

The multi-gradation printing can also be realized by improving the number of bits of each electric signal transmitted to the ink jet print head 30. In that connection, many electric signals are transferred to the piezoelectric element 2 and the number of electric signals to be processed per unit time increases. And, printers are usually confronted with technical problems and required to be improved in printing speed and in processing speed of the above electric signals. In a piezoelectric device provided in the ink jet print head 30, a switching element is formed in a flexible substrate as described above, transmission of electric signals to each piezoelectric element can be turned on/off quickly, so that the requirement of the above processing speed improvement is satisfied.

Next, a description will be made for both function and effect, of the ink jet print head in this fifth embodiment in comparison with a device that uses an actuator provided with the piezoelectric element described in the description of the related art.

Firstly, the flexible electronic device 10 can boost mounting yield. In other words, the flexible electronic device 10 has a thin film transistor circuit that includes a thin film transistor 16 in the flexible substrate 1 and a piezoelectric element 2 on the surface of the flexible substrate 1. Both the signal electrode 9 and the common electrode 11 of the piezoelectric element 2 are connected to the data signal line 9b and the common line 13 on the flexible substrate 1 respectively. So if the each height of the piezoelectric elements is different, there is no bad connection. Consequently, the flexible electronic device 10 can boost mounting yield.

In addition, because the flexible substrate 1 that is thinned is excellent in flexibility, the substrate 1 functions favorably as a means for transmitting the vibration of the piezoelectric element 2 to the object. The device 10 does not require a means for transmitting the vibration of the piezoelectric element 2. This contributes to the device being reduced in size.

The flexible electronic device 10 in this first embodiment can also be manufactured with a method that employs a silicon treatment process and this makes it possible to reduce the device in size. In addition, the thin film transistor circuit layer 5 can be formed so as to be buried in the flexible substrate 1, thereby the device is reduced in height. The common electrode 11 in this first embodiment doesn't need to be a common electrode of all elements. For example, the common electrode 11 is divided into two or more parts and may be driven by time-sharing.

While the embodiments of the present invention have been described with reference to the accompanying drawings, it is to be understood that modifications will be apparent to those skilled in the art without departing from the spirit of the invention.

For example, the ink jet printer described in the above embodiment is a printer in which ink is jetted with some energy and impacted on the print object, but the ink jet printer is also applied to circuit substrate manufacturing processes in which the ink is replaced with another liquid having, for example, high conductivity and the liquid is jetted and impacted on the substrate or the like to be formed as electric wirings. And, although an ink jetting configuration is employed as an example in the above embodiments, another liquid maybe used appropriately to the object printing.

Figure 15B:
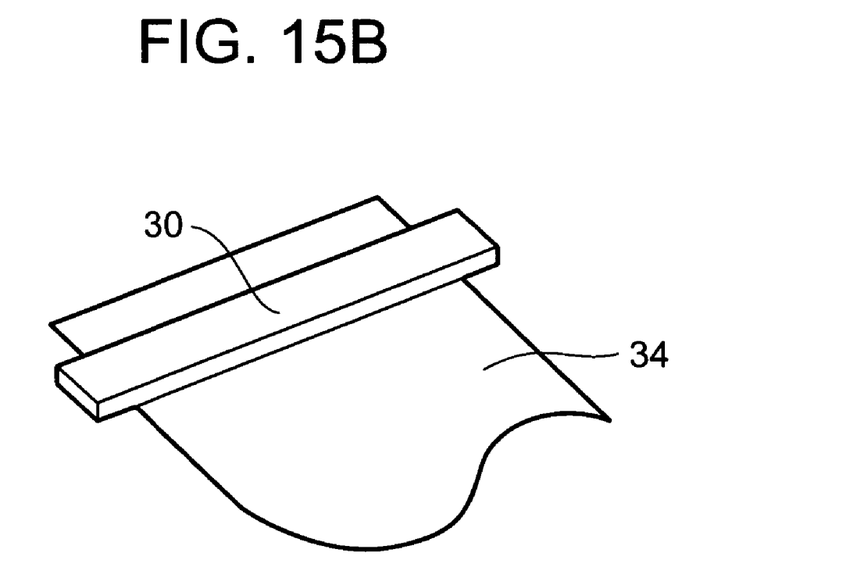
FIG. 15B is a perspective view of a configuration of a variation of the ink jet print head in the fifth embodiment.

The ink print head described in the above embodiment may be configured as shown in FIG. 15B. If the ink jet print head 30 is large enough with respect to the print object 34, the necessity for scanning in the A-B direction shown in FIG. 15A is lowered, so that the necessity for using the driving system 68 is also lowered. Consequently, printing is speeded up significantly, as well as the device is reduced in both manufacturing cost and in size, since the driving mechanism required for scanning in the A-B direction is omitted.

Further this piezoelectric device can be applied to a microphone, a displacement sensor, a pump, a speaker and so on.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

Further, it is the inventor's intent to retain all equivalents of the claimed invention even if the claims are amended during prosecution.

What is claimed is:

1. A piezoelectric device comprising:
   a flexible substrate;
   a piezoelectric element comprising a pair of electrodes, each of said pair of electrodes being disposed on said flexible substrate;
   a switching element connected to one of said pair of electrodes; and
   a common line connected to the other of said pair of electrodes,
   wherein said piezoelectric element is provided on a surface of said flexible substrate while said switching element is provided in said flexible substrate.

2. The piezoelectric device according to claim 1, wherein said switching element is a thin film transistor.

3. The piezoelectric device according to claim 1, wherein a plurality of said piezoelectric elements are disposed in a matrix on said flexible substrate.

4. The piezoelectric device according to claim 1, wherein said device further includes a supporting member for supporting said flexible substrate; and wherein said piezoelectric element is provided in a region between portions supported by said supporting member.

5. The piezoelectric device according to claim 4, wherein said switching element is provided at a portion of said flexible substrate, supported by said supporting member.

6. The piezoelectric device according to claim 1, wherein said flexible substrate is thinned.

7. The piezoelectric device according to claim 1, wherein said device further includes a vibration plate provided separately from said flexible substrate and in contact with said piezoelectric element.

8. The piezoelectric device according to claim 1, wherein said device further includes a circuit for sending an electric signal to said piezoelectric element to control its operation; and said switching element is provided between said piezoelectric element and said circuit.

9. The piezoelectric device according to claim 1, wherein said device further includes a circuit for receiving an electric signal from said piezoelectric element to read its operation; and said switching element is provided between said piezoelectric element and said circuit.

10. A droplet jetting device, comprising:
    a liquid housing part for housing a liquid;
    a nozzle connected to said liquid housing; and
    a piezoelectric device according to claim 1 configured so as to apply a pressure to said liquid housed in said liquid housing part.

11. An image output device for outputting an image by spraying droplets, wherein said image output device includes a droplet jetting device according to claim 10.

12. A method for driving the piezoelectric device according to claim 1 comprising: turning on said switching element according to a control signal; supplying a data signal to said piezoelectric element; and vibrating a movable region of said flexible substrate by transmitting movement of said piezoelectric element.

13. A method for driving the piezoelectric device according to claim 9 comprising: transforming said piezoelectric element according to an external force; and outputting an electric signal from said piezoelectric element through said switching element.

14. A method for driving the droplet jetting device according to claim 10 comprising:
    turning on said switching element according to a control signal;
    supplying a data signal to said piezoelectric element;
    vibrating a movable region of said flexible substrate by transmitting movement of said piezoelectric element; and
    jetting a droplet from said nozzle according to a pressure rising in said liquid housing.

* * * * *